US012317728B2

(12) United States Patent
Xu et al.

(10) Patent No.: US 12,317,728 B2
(45) Date of Patent: May 27, 2025

(54) DISPLAY PANEL AND DISPLAY DEVICE FOR INCREASED TRANSMITTANCE

(71) Applicants: Beijing BOE Display Technology Co., Ltd., Beijing (CN); BOE TECHNOLOGY GROUP CO., LTD., Beijing (CN)

(72) Inventors: Chuanxiang Xu, Beijing (CN); Qi Yao, Beijing (CN); Shi Shu, Beijing (CN); Guangcai Yuan, Beijing (CN); Haitao Huang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 387 days.

(21) Appl. No.: 17/633,431

(22) PCT Filed: Jan. 21, 2021

(86) PCT No.: PCT/CN2021/073142
§ 371 (c)(1),
(2) Date: Feb. 7, 2022

(87) PCT Pub. No.: WO2022/155857
PCT Pub. Date: Jul. 28, 2022

(65) Prior Publication Data
US 2023/0165108 A1  May 25, 2023

(51) Int. Cl.
*H10K 59/65* (2023.01)
*H10K 102/00* (2023.01)

(52) U.S. Cl.
CPC ....... *H10K 59/65* (2023.02); *H10K 2102/311* (2023.02)

(58) Field of Classification Search
CPC ............ H10K 59/65; H10K 2102/311; H10K 59/873; H10K 2102/351
(Continued)

(56) References Cited

U.S. PATENT DOCUMENTS

| 2017/0064173 A1 | 3/2017 | Yoo et al. |
| 2021/0134899 A1 | 1/2021 | Peng et al. |

(Continued)

FOREIGN PATENT DOCUMENTS

| CN | 107946341 A | * | 4/2018 | ......... H01L 27/3227 |
| CN | 110071150 A | | 7/2019 | |

(Continued)

OTHER PUBLICATIONS

Written Opinion for International Application No. PCT/CN2021/073142 mailed Oct. 20, 2021.

*Primary Examiner* — Nduka E Ojeh
*Assistant Examiner* — Laura M Dykes
(74) *Attorney, Agent, or Firm* — Perilla Knox & Hildebrandt LLP; Kenneth A. Knox

(57) ABSTRACT

A display panel and a display device are provided that relate to the technical field of display. The display panel has a first display area and at least one second display area at a side of the first display area, and a transmittance of the second display area is greater than that of the first display area. The display panel includes a base substrate, a driving circuit layer and a pixel light-emitting layer which are sequentially laminated. The base substrate includes at least one organic material layer which is provided with a first groove at least partially overlapping with the second display area. A thickness of a part of the at least one organic material layer close to the first groove gradually decreases from the first display (Continued)

area to the second display area. The display panel can improve the accuracy of a sensing result of the photosensitive assembly.

20 Claims, 13 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2021/0232794 A1* | 7/2021 | Lius | H01L 31/143 |
| 2021/0280825 A1* | 9/2021 | Beon | H10K 59/60 |
| 2021/0351382 A1* | 11/2021 | Chen | H10K 50/844 |
| 2021/0408496 A1* | 12/2021 | Choi | H10K 50/86 |
| 2022/0149135 A1* | 5/2022 | Choi | H10K 59/126 |
| 2022/0199702 A1* | 6/2022 | Park | H10K 50/86 |

FOREIGN PATENT DOCUMENTS

| | | | | |
|---|---|---|---|---|
| CN | 110518045 A | | 11/2019 | |
| CN | 210073852 U | | 2/2020 | |
| CN | 111128010 A | | 5/2020 | |
| CN | 111146359 A | | 5/2020 | |
| CN | 111211156 A | | 5/2020 | |
| CN | 111261800 A | | 6/2020 | |
| CN | 111370446 A | | 7/2020 | |
| CN | 111508993 A | | 8/2020 | |
| CN | 111509013 A | * | 8/2020 | ........... H01L 27/323 |
| CN | 111725274 A | | 9/2020 | |
| WO | 2020133720 A1 | | 7/2020 | |
| WO | 2020155564 A1 | | 8/2020 | |

* cited by examiner

DISPLAY PANEL AND DISPLAY DEVICE FOR INCREASED TRANSMITTANCE

CROSS-REFERENCE TO RELATED APPLICATION

The present disclosure is a national phase application under 35 U.S.C. § 371 of International Application No. PCT/CN2021/073142 filed Jan. 21, 2021, the contents of which being incorporated by reference in their entirety herein.

TECHNICAL FIELD

The present disclosure relates to the technical field of display and, in particular, to a display panel and a display device.

BACKGROUND

Organic Light Emitting Diode (OLED) display panels have various advantages, such as high color gamut, thinness, and flexibility, and they are widely used in the display field. However, in the related art, the OLED display panel has a relatively low transmittance and is generally yellowish, so that an image obtained by a camera provided under the OLED display panel tends to have an abnormal color.

It should be noted that the information disclosed in the above "Background" section is merely intended to reinforce understanding of the background technology of the present disclosure, accordingly the Background may include information that does not constitute the prior art as already known by an ordinary person skilled in the art.

SUMMARY

An objective of the present disclosure is to overcome the above-mentioned shortcomings in the related art. Thus, the present disclosure provides a display panel and a display device, improving the accuracy of a sensing result of a photosensitive assembly.

According to an aspect of the present disclosure, a display panel is provided. The display panel has a first display area and at least one second display area at a side of the first display area. A transmittance of the second display area is greater than a transmittance of the first display area.

The display panel includes a base substrate, a driving circuit layer and a pixel light-emitting layer which are sequentially laminated.

The base substrate includes at least one organic material layer. The at least one organic material layer is provided with a first groove, and the first groove at least partially overlaps with the second display area. A thickness of a part of the at least one organic material layer close to the first groove gradually decreases from the first display area to the second display area.

In an exemplary embodiment of the present disclosure, a slope angle of the at least one organic material layer is 10 degrees to 60 degrees at a position close to the first groove.

In an exemplary embodiment of the present disclosure, in the direction from the first display area to the second display area, a width of an orthographic projection of the at least one organic material layer close to a side wall of the first groove on the base substrate is not more than 30 microns.

In an exemplary embodiment of the present disclosure, an orthographic projection of the first groove on the base substrate covers the second display area.

In an exemplary embodiment of the present disclosure, the base substrate includes a first organic material layer, a first barrier layer and a second organic material layer which are sequentially laminated, and the driving circuit layer is arranged at a side of the second organic material layer away from the first organic material layer; and the first groove is arranged at a side of the second organic material layer away from the first organic material layer.

In an exemplary embodiment of the present disclosure, the first groove penetrates through the second organic material layer and exposes a part of the first barrier layer.

In an exemplary embodiment of the present disclosure, the base substrate includes a first organic material layer, a first barrier layer and a second organic material layer which are sequentially laminated, and the driving circuit layer is arranged at a side of the second organic material layer away from the first organic material layer; and the first organic material layer is provided with the first groove at a side close to the driving circuit layer.

In an exemplary embodiment of the present disclosure, the first groove penetrates through the first organic material layer.

In an exemplary embodiment of the present disclosure, the first barrier layer has a hollowed-out hole exposing the first groove; an edge of the hollowed-out hole substantially coincides with an edge of the first groove close to an opening of the first barrier layer.

In an exemplary embodiment of the present disclosure, a transmittance of the second organic material layer is greater than that of the first organic material layer.

In an exemplary embodiment of the present disclosure, a size of a notch of the first groove is larger than a size of a bottom of the first groove.

In an exemplary embodiment of the present disclosure, the display panel further includes a first filling material layer, the first filling material layer is located between the base substrate and the driving circuit layer and located in the first groove; and a transmittance of the first filling material layer is greater than a transmittance of the first organic material layer.

In an exemplary embodiment of the present disclosure, the base substrate includes a first organic material layer, a first barrier layer and a second organic material layer which are sequentially laminated, and the driving circuit layer is arranged at a side of the second organic material layer away from the first organic material layer; and the first organic material layer is provided with the first groove at a side away from the driving circuit layer.

In an exemplary embodiment of the present disclosure, the display panel further includes a second filling material layer embedded in the first groove; and a transmittance of the second filling material layer is greater than a transmittance of the first organic material layer.

In an exemplary embodiment of the present disclosure, the base substrate includes a first organic material layer, a first barrier layer and a second organic material layer which are sequentially laminated, and the driving circuit layer is arranged at a side of the second organic material layer away from the first organic material layer; the first groove is arranged in the second organic material layer; and the first organic material layer is also provided with a second groove at a side thereof away from the driving circuit layer, and an orthographic projection of the second groove on the base substrate covers the second display area.

In an exemplary embodiment of the present disclosure, a slope angle of the first organic material layer is 80 degrees to 90 degrees at a position close to the second groove.

In an exemplary embodiment of the present disclosure, the display panel further includes a third filling material layer embedded in the second groove; a transmittance of the third filling material layer is greater than a transmittance of the first organic material layer.

In an exemplary embodiment of the present disclosure, the display panel further includes a back film layer located at a side of the base substrate away from the driving circuit layer; the back film layer is provided with an opening, and the second display area is located in an orthographic projection of the opening on the base substrate.

In an exemplary embodiment of the present disclosure, the display panel further includes a second barrier layer and a buffer layer which are sequentially laminated between the base substrate and the driving circuit layer, the buffer layer is located at a side of the second barrier layer away from the base substrate; and the display panel may further include a planarization layer located between the pixel light-emitting layer and the driving circuit layer.

In an exemplary embodiment of the present disclosure, the display panel further includes a touch layer and an anti-drop layer which are sequentially laminated at a side of the pixel light-emitting layer away from the base substrate, the anti-drop layer includes a black matrix layer and a color film layer.

According to another aspect of the present disclosure, a display device is provided. The display device includes the display panel as described above and at least one photosensitive assembly, and the photosensitive assembly is located at a side of the display panel close to the substrate and directly faces the second display area.

It should be understood that the above general description and the following detailed description are exemplary and explanatory only, and do not limit the present disclosure.

BRIEF DESCRIPTION OF THE DRAWINGS

The accompanying drawings, which are incorporated into and constitute a part of this specification, illustrate embodiments consistent with the present disclosure and together with the description serve to explain the principles of the present disclosure. Understandably, the drawings in the following description are only intended to illustrate some embodiments of the present disclosure, and for those ordinarily skilled in the art, other drawings can be obtained according to these drawings without paying creative efforts.

DETAILED DESCRIPTION

Figure 1:
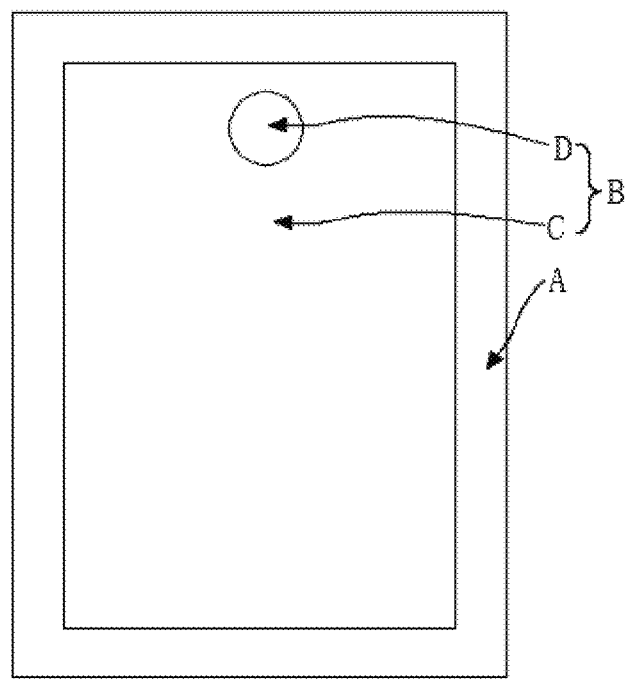
FIG. 1 is a top structural schematic view of a display panel in an embodiment of the present disclosure.

Exemplary embodiments will now be described more fully by reference to the accompanying drawings. However, the exemplary embodiments can be implemented in various forms and should not be understood as being limited to the examples set forth herein; rather, the embodiments are provided so that the present disclosure will be thorough and complete, and the conception of exemplary embodiments will be fully conveyed to those skilled in the art. The same reference signs in the drawings denote the same or similar structures and detailed description thereof will be omitted. In addition, the drawings are merely schematic illustrations of the present disclosure and are not necessarily drawn to scale.

The wordings "a", "a", "the", "said", and "at least one" are used to indicate the presence of one or more elements/components/etc. The terms "include", "comprise", and "have" are used to express an open-ended inclusive meaning and mean that there may be other elements/components/etc. besides the listed elements/components/etc. The terms "first", "second", and "third" are only used as marks, and not as a limit to the number of their objects.

Reference numbers used in the drawings are as follows: 100—back film layer; 110—adhesion layer; 101—opening; 200—base substrate; 210—organic material layer; 211—first organic material layer; 212—first barrier layer; 213—second organic material layer; 201—anti-reflection groove; 202—hollowed-out hole; 203—thinning groove; 300—driving circuit layer; 301—transistor; 310—semiconductor layer; 320—gate insulating layer; 330—gate layer; 340—interlayer dielectric layer; 350—source-drain metal layer; 400—pixel light-emitting layer; 410—pixel electrode layer; 420—pixel definition layer; 430—support column layer; 440—organic light-emitting functional layer; 450—common electrode layer; 500—thin film encapsulation layer; 510—first inorganic encapsulation layer; 520—organic encapsulation layer; 530—second inorganic encapsulation layer; 600—touch function layer; 700—anti-drop layer; 801—cover plate; 802—optical adhesive layer; 803—second barrier layer; 804—buffer layer; 805—planarization layer; 806—first filling material layer; 807—second filling material layer; 808—third filling material layer; 901—photosensitive assembly; 902—supporting substrate; 903—protruding layer; A—peripheral area; B—display area; C—first display area; and D—second display area.

In the related art, the OLED display panel may include a base substrate, a driving circuit layer, and a pixel light-emitting layer which are sequentially laminated. The driving circuit layer is provided with pixel driving circuits, and each of the pixel driving circuits is configured to drive a corresponding one of pixels in the pixel light-emitting layer. In order to improve the flexibility of the display panel, the base substrate may have an organic material, such as a polyimide material. However, in order to effectively support film layers on the display panel, the base substrate needs to have a certain mechanical strength, so that a variety of additives are often added to the organic material of the base substrate, and these additives tends to decrease an absorbance of the base substrate and have different absorptivities for different wavelengths of light. For example, in the related art, the polyimide material as the base substrate tends to have high absorbance and especially, have high absorbance for blue light, which enables the display panel to have high yellow coefficient.

Figure 2:
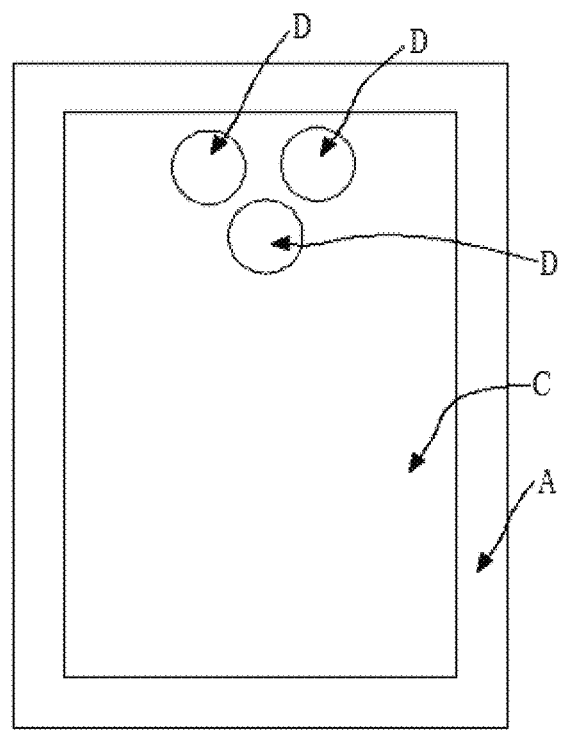
FIG. 2 is a top structural schematic view of a display panel in an embodiment of the present disclosure.

The present disclosure provides a display panel. Referring to FIGS. 1 and 2, the display panel has a first display area C and at least one second display area D at a side of the first display area C. A transmittance of the second display area D is greater than a transmittance of the first display area C.

Referring to FIGS. 4 to 17, the display panel includes a base substrate 200, a driving circuit layer 300, and a pixel light-emitting layer 400 which are sequentially laminated. The base substrate 200 includes at least one organic material layer 210, the at least one organic material layer 210 is provided with an anti-reflection groove 201 (i.e., a groove for increasing light transmission), and the anti-reflection groove 201 at least partially overlaps with the second display area D. A thickness of a part of at least one organic material layer 210 close to the anti-reflection groove 201 gradually decreases in a direction from the first display area C to the second display area D.

In the present disclosure, the display panel has the second display area D with higher transmittance, and the second display area D may be used for a photosensitive assembly 901 to sense light on a light extraction side of the display panel. In other words, in the display device applying the display panel, the photosensitive assembly 901 may be arranged on a back surface of the display panel and directly face the second display area D. The transmittance of the second display area D is high, thereby improving the accuracy of a sensing result of the photosensitive assembly 901, for example, the accuracy of an image collected by a camera.

The base substrate 200 of the display panel is provided with the anti-reflection groove 201 at least partially overlapping with the second display area D, so that the anti-reflection groove 201 may reduce an absorption of the light transmitted from the second display area D by the base substrate 200, and further improve the transmittance of the display panel in the second display area D. The thickness of the part of the at least one organic material layer 210 of the base substrate 200 close to the anti-reflection groove 201 gradually decreases in the direction from the first display area C to the second display area D, so that a side wall of the anti-reflection groove 201 is not perpendicular to a plane where the base substrate 200 is located, avoiding adverse effects on the driving circuit layer 300 and the pixel light-emitting layer 400 due to the perpendicular arrangement of the side wall of the anti-reflection groove 201, and ensuring a display quality of the display panel.

Thereinafter, the structure, principle, and effect of the display panel of the present disclosure will be further explained and described with reference to the accompanying drawings.

Figure 3:
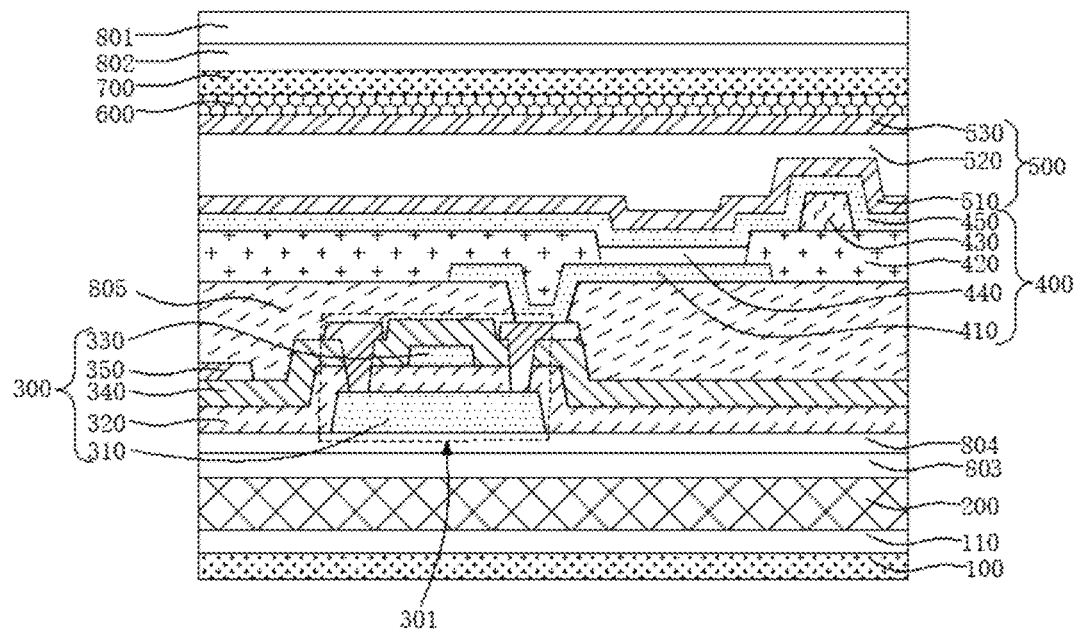
FIG. 3 is a partially sectional structural schematic view of a display panel in an embodiment of the present disclosure.

The present disclosure provides a display panel. Referring to FIG. 3, the display panel includes a base substrate 200, a driving circuit layer 300 and a pixel light-emitting layer 400 which are sequentially laminated. The driving circuit layer 300 may be formed with a plurality of pixel driving circuits, and the pixel light-emitting layer 400 may be formed with a plurality of organic light emitting diodes as sub-pixels. Each of the pixel driving circuits is configured to drive a corresponding sub-pixel.

In the driving circuit layer 300, any one of pixel driving circuits may include a thin film transistor 301 and a storage capacitor. The thin film transistor may be a top gate type thin film transistor, a bottom gate type thin film transistor or a double gate type thin film transistor. A material of the active layer of the thin film transistor may be amorphous silicon semiconductor material, low-temperature polysilicon semiconductor material, metal oxide semiconductor material, organic semiconductor material or other types of semiconductor materials. The thin film transistor may be an N-type thin film transistor or a P-type thin film transistor. In an embodiment of the present disclosure, the thin film transistor 301 is a low-temperature polysilicon transistor.

The driving circuit layer 300 may include a semiconductor layer 310, a gate insulating layer 320, a gate layer 330, an interlayer dielectric layer 340, a source-drain metal layer 350 and the like laminated between the base substrate 200 and the pixel light-emitting layer 400. Each of the thin film transistors 301 and the storage capacitor may be formed by the semiconductor layer 310, the gate insulating layer 320, the gate layer 330, the interlayer dielectric layer 340, the source-drain metal layer 350 or the like. A positional relationship of the film layers may be determined according to the film layer structure of the thin film transistor 301. For example, in an embodiment of the present disclosure, the driving circuit layer 300 may include the semiconductor layer 310, the gate insulating layer 320, the gate layer 330, the interlayer dielectric layer 340, and the source-drain metal layer 350, which are sequentially laminated, so that the formed thin film transistor 301 is in a top gate type. For another example, in another embodiment of the present disclosure, the driving circuit layer may include the gate layer, the gate insulating layer, the semiconductor layer, the interlayer dielectric layer and the source-drain metal layer which are sequentially laminated, and the formed thin film transistor is in a bottom gate type. The driving circuit layer may also has a double gate layer structure, that is, the gate layer may include a first gate layer and a second gate layer, the gate insulating layer may include a first gate insulating layer for isolating the semiconductor layer from the first gate layer and a second gate insulating layer for isolating the first gate layer from the second gate layer. For example, in an embodiment of the present disclosure, the driving circuit layer may include the semiconductor layer, the first gate insulating layer, the first gate layer, the second gate insulating layer, the second gate layer, the interlayer dielectric layer and the source-drain metal layer which are sequentially laminated at a side of the base substrate.

Figure 26:
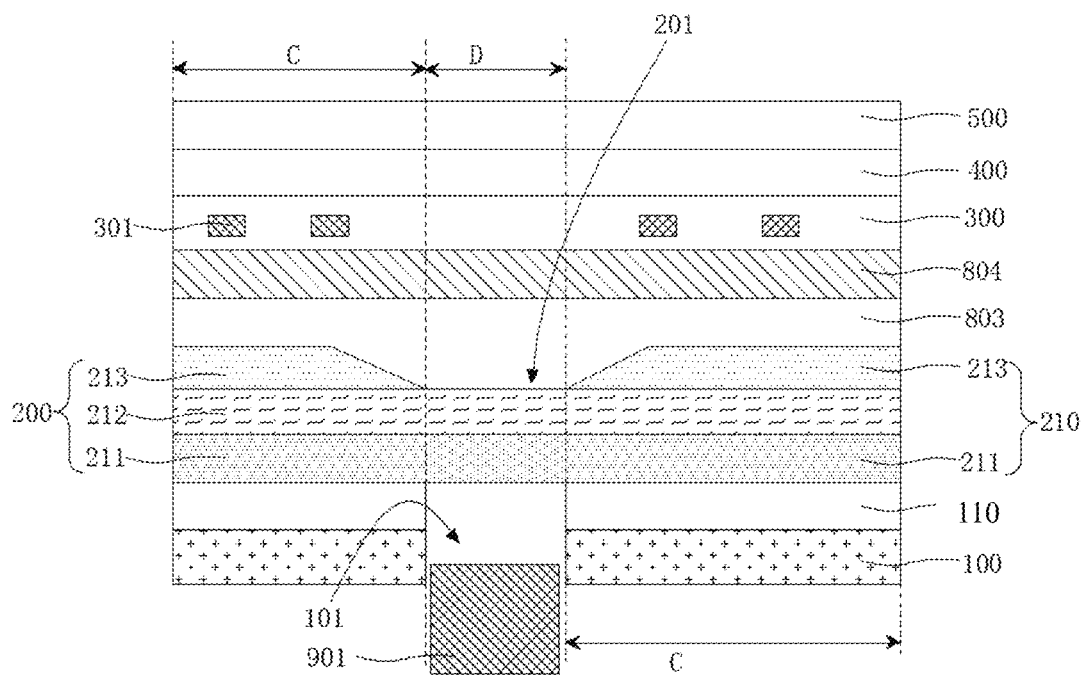
FIG. 26 is a partially sectional structural schematic view of a display device in an embodiment of the present disclosure.

In an embodiment of the present disclosure, referring to FIG. 26, a transistor may not be provided in the second display area D in order to reduce the influence of the pixel driving circuit on the transmittance. The pixel driving circuits of the sub-pixels located in the second display area D may be arranged in the first display area C. In other embodiments of the present disclosure, referring to FIG. 16, a transistor may also be provided in the second display area D. The density of pixel driving circuits in the second display area D may be the same as that in the first display area C or lower than that in the first display area C.

Optionally, the driving circuit layer 300 may further include a passivation layer, and the passivation layer may be arranged on a surface of the source-drain metal layer 350 away from the base substrate 200 to protect the source-drain metal layer 350.

Optionally, the display panel may also include a buffer material layer between the base substrate 200 and the driving circuit layer 300, and the semiconductor layer 310, the gate layer 330, and the like are located at a side of the buffer material layer away from the base substrate 200. The buffer material layer may be made of an inorganic insulating material such as silicon oxide and silicon nitride. The buffer material layer may be a layer of the inorganic material layer or a multilayer laminated inorganic material layer. For example, in an embodiment of the present disclosure, referring to FIG. 3, the buffer material layer may include a second barrier layer 803 at a side close to the base substrate 200 and a buffer layer 804 at a side of the second barrier layer 803 away from the base substrate 200. The second barrier layer 803 is configured to block permeation of ions and other components in the base substrate 200 into the driving circuit layer 300, so that the driving circuit layer 300 may maintain stable performance. The buffer layer 804 may improve a bonding force between the driving circuit layer 300 and the base substrate 200 and provide a stable environment for the driving circuit layer 300.

Referring to FIG. 3, the pixel light-emitting layer 400 may be arranged at a side of the driving circuit layer 300 away from the base substrate 200, and may include a pixel electrode layer 410, a pixel definition layer 420, a support column layer 430, an organic light-emitting functional layer 440 and a common electrode layer 450 which are sequentially laminated. The pixel electrode layer 410 has a plurality of pixel electrodes in the display area B of the display panel. The pixel definition layer 420 has a plurality of pixel openings in the display area B, which are penetrated through the display area and arranged corresponding to a plurality of pixel electrodes one-to-one, and any one of the pixel openings exposes at least part of the corresponding pixel electrode. The support column layer 430 includes a plurality of support columns in the display area B, and the support columns are located on a surface of the pixel definition layer 420 away from the base substrate 200, so as to support a Fine Metal Mask (FMM) in an evaporation process. The light-emitting functional layer 440 at least covers the pixel electrode exposed by the pixel definition layer 420. The organic light-emitting functional layer 440 may include an organic electroluminescent material layer, and may include one or more of a hole injection layer, a hole transport layer, an electron barrier layer, a hole barrier layer, an electron transport layer, and an electron injection layer. The film layers of the organic light-emitting functional layer 440 may be prepared by the evaporation process, and a fine metal mask or an open mask may be used to define a pattern of each of the film layers during evaporation. The common electrode layer 450 may cover the organic light-emitting functional layer 440 in the display area B. In this way, the pixel electrode, the common electrode layer 450 and the organic light-emitting functional layer 440 between the pixel electrode and the common electrode layer 450 form organic light-emitting diodes, and any one of the organic light-emitting diodes may be used as a sub-pixel of the display panel.

In some embodiments, the pixel light-emitting layer 400 may further include a light extraction layer located at a side of the common electrode layer 450 away from the base substrate 200 to enhance the light extraction efficiency of the organic light-emitting diode.

In an embodiment of the present disclosure, in the second display area D, both the pixel electrode and the common electrode are transparent electrodes to improve the transmittance of the second display area D. In other embodiments of the present disclosure, the pixel electrode of the second display area D may also have a reflective layer to ensure a luminance of the display panel in the second display area D.

Optionally, referring to FIG. 3, the display panel may further include a planarization layer 805 located between the driving circuit layer 300 and the pixel light-emitting layer 400, and the planarization layer 805 may provide a planarization surface for the pixel electrode. Optionally, the planarization layer 805 may be made of an organic material.

Optionally, referring to FIG. 3, the display panel may further include a thin film encapsulation layer 500. The thin film encapsulation layer 500 is arranged on a surface of the pixel light-emitting layer 400 away from the base substrate 200, and may include an inorganic encapsulation layer and an organic encapsulation layer 520 alternately laminated. The inorganic encapsulation layer may effectively block the external moisture and oxygen, and avoid the material degradation caused by invasion of moisture and oxygen into the organic light-emitting functional layer 440. Optionally, an edge of the inorganic encapsulation layer may be located in the peripheral area A. The organic encapsulation layer 520 is located between two adjacent inorganic encapsulation layers in order to realize planarization and reduce the stress between the inorganic encapsulation layers. An edge of the organic encapsulation layer 520 is located between the display area B and the edge of the inorganic encapsulation layer. Exemplarily, referring to FIG. 3, the thin film encapsulation layer 500 includes a first inorganic encapsulation layer 510, an organic encapsulation layer 520 and a second inorganic encapsulation layer 530 which are sequentially laminated at a side of the pixel light-emitting layer 400 away from the base substrate 200.

Figure 27:
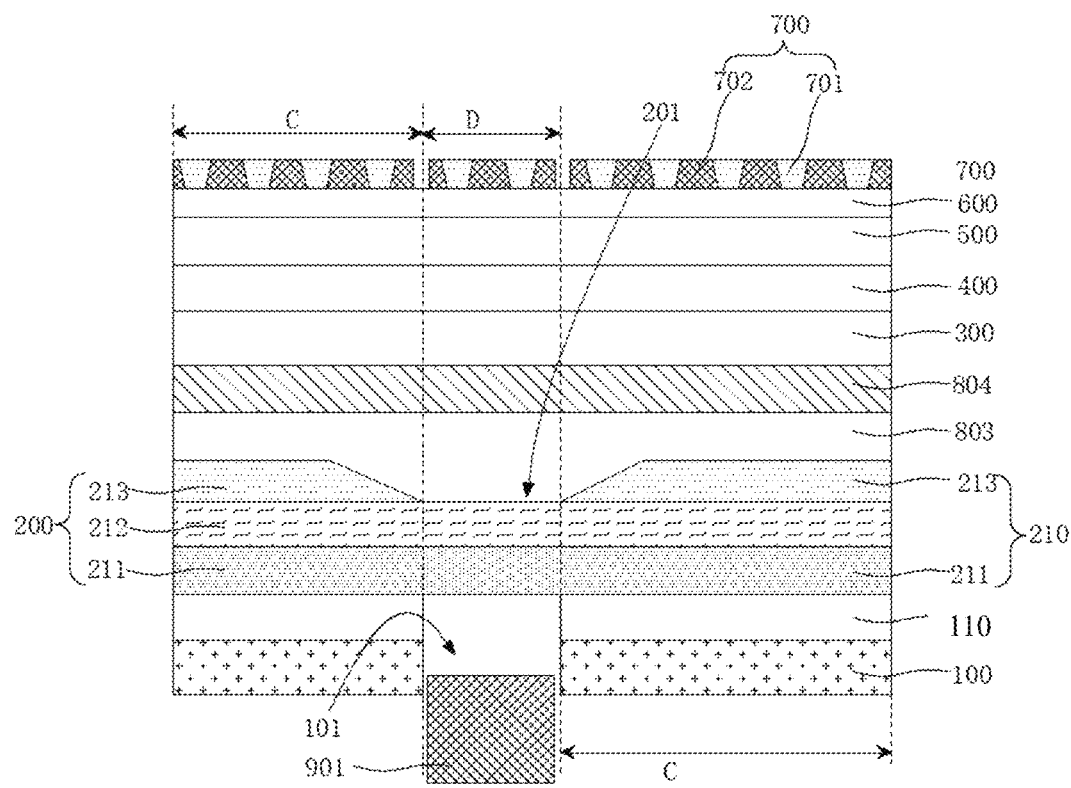
FIG. 27 is a partially sectional structural schematic view of a display device in an embodiment of the present disclosure.

Optionally, referring to FIG. 3, the display panel may further include an anti-drop layer 700, and the anti-drop layer 700 may be arranged at a side of the thin film encapsulation layer 500 away from the pixel light-emitting layer 400 to reduce the reflection of the ambient light by the display panel, thereby reducing the influence of the ambient light on the display effect. In an embodiment of the present disclosure, referring to FIG. 27, the anti-drop layer 700 may include a color film layer 701 and a black matrix layer 702 which are laminated, thereby reducing the interference of ambient light and avoiding reducing the transmittance of the display panel. In another embodiment of the present disclosure, the anti-drop layer 700 may be a polarizer, for example, a patterned coated circular polarizer.

In an embodiment of the present disclosure, the anti-drop layer 700 may not cover the second display area D to improve the transmittance of the second display area D. In other words, the anti-drop layer 700 may not be provided in the second display area D. In other embodiments of the present disclosure, referring to FIG. 17, the second display area D may also have an anti-drop layer 700 to improve the display effect of the second display area D. Optionally, when the anti-drop layer 700 is provided in the second display area D, the anti-drop layer 700 may also have a hollowed-out design in the second display area D. The anti-drop layer 700 only covers a part of the second display area D and exposes a part thereof, so as to achieve a balance between improving the transmittance of the second display area D and improving the display effect of the second display area D.

Optionally, referring to FIG. 3, the display panel may further include a touch function layer 600, and the touch function layer 600 is arranged at a side of the film packaging layer 500 away from the base substrate 200 for realizing the touch operation of the display panel. In an embodiment of the present disclosure, the touch function layer 600 may be arranged between the thin film encapsulation layer 500 and the anti-drop layer 700.

Optionally, referring to FIG. 3, the display panel may further include a back film layer 100, and the back film layer 100 may be arranged at a side of the base substrate 200 away from the pixel light-emitting layer 400 for supporting the display panel. Further, the back film layer 100 may be connected with the base substrate 200 by the adhesion layer 110.

Optionally, referring to FIG. 3, the display panel may further include a cover plate 801, and the cover plate 801 may be located at an outermost side of the light extraction side of the display panel to protect the display panel. The cover plate 801 may be an inorganic light-transmitting material, such as glass. The cover plate 801 may also be a light-transmitting organic material. Optionally, the cover plate 801 may be attached to other film layer of the display panel through an optical adhesive layer 802, for example, to a side of the anti-drop layer 700 of the display panel away from the base substrate 200.

FIGS. 1 and 2 are top views of a display panel. Referring to FIGS. 1 and 2, the display panel may include a display area B and a peripheral area A around the display area B. The display area B may include a first display area C and at least one second display area D at a side of the first display area C. In both the first display area C and the second display area D, the pixel light-emitting layer 400 may be provided with pixels, so that both the first display area C and the second display area D can realize normal image display.

FIGS. 4 to 17 are sectional schematic views of a display device using the display panel at a position close to the second display area D. The display device includes at least one photosensitive assembly 901. The photosensitive assembly 901 may correspond to the second display area D in a one-to-one correspondence, and the photosensitive assembly 901 may directly face the corresponding second display area D, so as to receive the light transmitted from the second display area D. Referring to FIGS. 4 to 17, the photosensitive assembly 901 may have a photosensitive area for sensing light, and an orthographic projection of the photosensitive area on the base substrate 200 may be located in the second display area D. The photosensitive assembly 901 may be one or more light sensors, for example, a camera, an optical fingerprint identification chip, or the like. In some embodiments, the photosensitive assembly 901 may be a camera, for example, a CCD (Charge Coupled Device) camera. Thus, the display device may realize the under-screen camera and increase the screen-to-body ratio of the display device.

Optionally, referring to FIGS. 1 and 2, the second display area D may be embedded in the first display area C, that is, the first display area C surrounds around the second display area D. When a plurality of second display areas D are provided, the second display areas D may be dispersedly distributed or arranged adjacent to each other.

Optionally, any one of the second display areas D may be shaped as a circle, a square, a diamond, a regular hexagon, or another shape. In an embodiment of the present disclosure, the second display area D may be shaped as a circle.

One or more second display areas D may be provided to meet the arrangement of the photosensitive assembly 901. In an embodiment of the present disclosure, one second display area D is provided. In this way, the display device may be provided with an under-screen photosensitive assembly 901, for example, an under-screen camera or an under-screen optical fingerprint identification chip. In another embodiment of the present disclosure, a plurality of second display areas D may be provided. In this way, the display device may be provided with a plurality of photosensitive assemblies 901, and any two of the photosensitive assemblies 901 may be the same or different.

For example, referring to FIG. 2, three second display areas D are provided and arranged adjacent to each other. In this way, the display device may be provided with different photosensitive assemblies 901 corresponding to the three second display areas D one-to-one, for example, three different photosensitive assemblies 901 such as an imaging camera, a deep camera and an infrared camera are provided.

Optionally, the anti-reflection grooves 201 are arranged to correspond to second display areas D one-to-one, and any one of the second display areas D at least partially overlaps with a corresponding anti-reflection groove 201. Further, the second display area D is located in the corresponding anti-reflection groove 201, that is, an orthographic projection of the anti-reflection groove 201 on the base substrate 200 covers the corresponding second display area D, thereby avoiding that a change of a thickness of the organic material layer 210 of the base substrate 200 enables a change of the transmittance at different positions in the second display area D. In other embodiments of the present disclosure, the number of anti-reflection grooves 201 may be less than the number of second display areas D, so that one of the anti-reflection grooves 201 may at least partially overlap with a plurality of second display areas D.

In the present disclosure, the anti-reflection groove 201 has two annular edges which are oppositely arranged, and a size of one of the edges is larger than a size of the other edge. The orthographic projection of the anti-reflection groove 201 on the base substrate 200 refers to an orthographic projection of a smaller edge of the anti-reflection groove 201 on the base substrate 200, that is, an orthographic projection of a bottom of the anti-reflection groove 201 on the base substrate 200. When the anti-reflection groove 201 penetrates through at least one organic material layer 210, a smaller open end of the anti-reflection groove 201 may serve as the bottom of the anti-reflection groove 201, and a larger open end of the anti-reflection groove 201 may serve as a notch of the anti-reflection groove 201. When the notch of the anti-reflection groove 201 is located at a side of the bottom away from the base substrate 200, the anti-reflection groove 201 is an anti-reflection groove 201 that opens toward the light extraction side of the display panel, that is, a first anti-reflection groove 201. When the notch of the anti-reflection groove 201 is located at a side of the bottom close to the base substrate 200, the anti-reflection groove 201 is the anti-reflection groove 201 that opens towards a back surface of the display panel, that is, a second anti-reflection groove 201.

Optionally, the second display area D is completely located in the anti-reflection groove 201, that is, the second display area D is completely located in the orthographic projection of the anti-reflection groove 201 on the base substrate 200.

Optionally, referring to FIGS. 4 to 17, a slope angle of at least one organic material layer 210 is 10 degrees to 60 degrees at a position close to the anti-reflection groove 201. In other words, an included angle between a side wall of the anti-reflection groove 201 and a plane where the display panel is located may range from 10 degrees to 60 degrees, and the side wall of the anti-reflection groove 201 is a surface of the organic material layer 210 connecting the bottom and the notch of the anti-reflection groove 201. In this way, a slope of the anti-reflection groove 201 is relatively gentle, which can avoid each of conductive structures in the driving circuit layer 300 and the pixel light-emitting layer 400 from having a larger climbing angle at the side wall of the anti-reflection groove 201, and further avoid the driving circuit layer 300 and the pixel light-emitting layer 400 from having poor broken wires. Alternatively, the slope angle of the organic material layer 210 is in a range of 23 degrees to 33 degrees. For example, in an embodiment of the present disclosure, the slope angle of the organic material layer 210 is 28.23 degrees.

Optionally, in the direction from the first display area C to the second display area D, a width of an orthographic projection of at least one organic material layer 210 close to the side wall of the anti-reflection groove 201 on the base substrate 200 may not be greater than 30 microns. In other words, a width of the orthographic projection of the side wall of the anti-reflection groove 201 on the base substrate 200 may not be greater than 30 microns. At the side wall of the anti-reflection groove 201, it is difficult to ensure the uniformity of the semiconductor layer 310 in the driving circuit layer 300, and thus it is not appropriate to arrange the transistor 301 in the driving circuit layer 300 at this position. By reducing the width of the orthographic projection of the side wall of the anti-reflection groove 201 on the base substrate 200, it is possible to provide more sufficient space for arranging transistors.

Optionally, referring to FIGS. 4 to 17, in the base substrate 200, at least one organic material layer 210 may include a first organic material layer 211 and a second organic material layer 213, and a first barrier layer 212 may be sandwiched between the first organic material layer 211 and the second organic material layer 213. The driving circuit layer 300 is arranged at a side of the second organic material layer 213 away from the first organic material layer 211.

In some embodiments, the first organic material layer 211 and the second organic material layer 213 may be made of materials that may meet the mechanical performance requirements of the base substrate 200, for example, some yellowish polyimide materials may be used. The first barrier layer 212 may shield the first organic material layer 211 to prevent additives, ions, and the like in the first organic material layer 211 from permeating into the driving circuit layer 300. The first barrier layer 212 may also be configured to balance a stress between the first organic material layer 211 and the second organic material layer 213. In the display panel provided by the present disclosure, the organic material layer 210 of the base substrate 200 is provided with the anti-reflection groove 201, which realizes the thinning of the organic material layer 210 of the base substrate 200. Therefore, the transmittance of the display panel of the present disclosure in the second display area D is enhanced. Also, since the organic material layer 210 in the base substrate 200 is thinned, an absorbance difference of the display panel in the second display area D for different wavelength bands is reduced, and a yellow light coefficient of the display panel in the second display area D may be reduced. In this way, the accuracy of light detection by the photosensitive assembly 901 may be improved, for example, the entire image collected by the camera may be prevented from yellowing. In addition, the base substrate 200 may only be provided with the anti-reflection groove 201 at or close to the second display area D, and the size of the second display area D is often relatively small, and therefore, the mechanical properties of the base substrate 200 will not be greatly affected.

In other embodiments, the first organic material layer 211 may be made of a material that may meet the mechanical performance requirements of the base substrate 200, for example, some yellowish polyimide materials may be used. The first barrier layer 212 may shield the first organic material layer 211 to prevent additives, ions, and the like in the first organic material layer 211 from permeating into the driving circuit layer 300. The second organic material layer 213 may be made of a material with high transmittance, such as colorless and transparent polyimide material, so that the transmittance of the second organic material layer 213 is greater than that of the first organic material layer 211, thereby improving the transmittance of the display panel.

Alternatively, a thickness of each of the first organic material layer 211 and the second organic material layer 213 may be in a range of 3 microns to 20 microns. Optionally, the thickness of each of the first organic material layer 211 and the second organic material layer 213 may be in a range of 5 microns to 15 microns to meet the performance requirements of the display panel on the base substrate 200.

Optionally, the thickness of the second organic material layer 213 may not be less than the thickness of the first organic material layer 211. Further, the thickness of the second organic material layer 213 may be 1 to 4 times the thickness of the first organic material layer 211.

For example, in an embodiment of the present disclosure, the thickness of the first organic material layer 211 is 5 microns, and the thickness of the second organic material layer 213 is 5 microns. For another example, in another embodiment of the present disclosure, the thickness of the first organic material layer 211 is 5 microns, and the thickness of the second organic material layer 213 is 10 microns. For another example, in another embodiment of the present disclosure, the thickness of the first organic material layer 211 is 5 microns and the thickness of the second organic material layer 213 is 15 microns.

Figure 4:
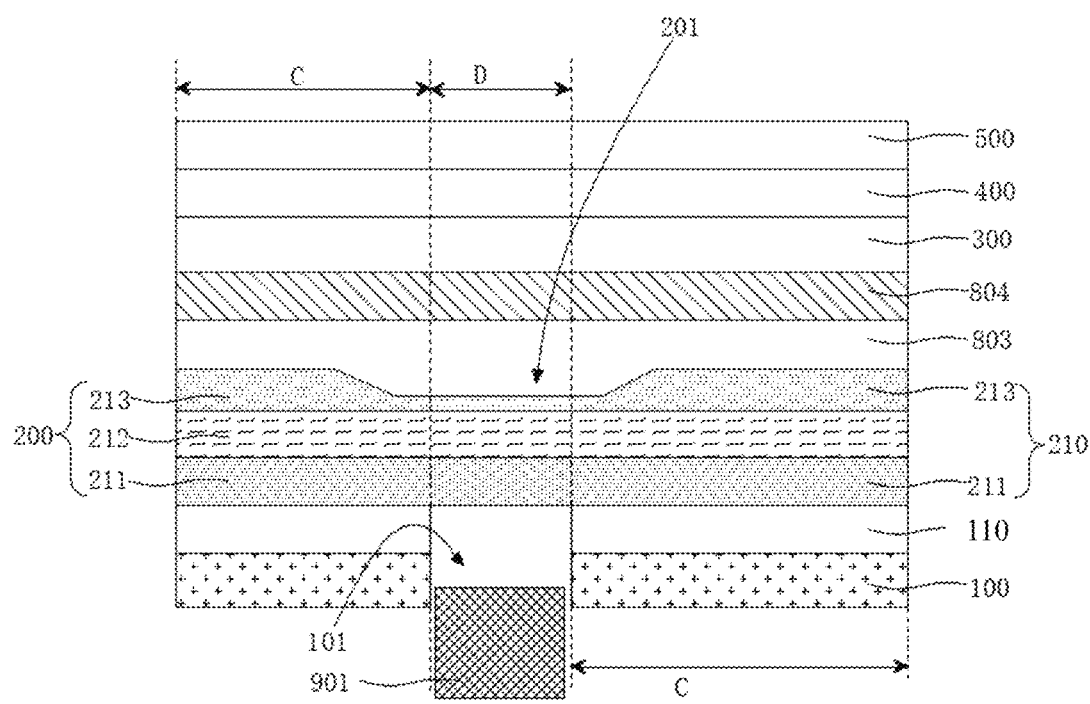
FIG. 4 is a partially sectional structural schematic view of a display device in an embodiment of the present disclosure.

In some embodiments, referring to FIG. 4, the anti-reflection groove 201 may be arranged at a side of the second organic material layer 213 away from the first organic material layer 211. In other words, the second organic material layer 213 may be partially thinned to form the anti-reflection groove 201. In this way, the thickness of the organic material of the base substrate 200 in the second display area D may be reduced, and then the transmittance of the display panel in the second display area D may be improved.

Alternatively, a depth of the anti-reflection groove 201 may be 0.5-1 times the thickness of the second organic material layer 213. Further, the depth of the anti-reflection groove 201 may be 0.8 to 1 times the thickness of the second organic material layer 213. In the present disclosure, the depth of the anti-reflection groove 201 refers to an interval between a plane where the notch of the anti-reflection groove 201 is located and a plane where the bottom of the anti-reflection groove 201 is located.

Figure 5:
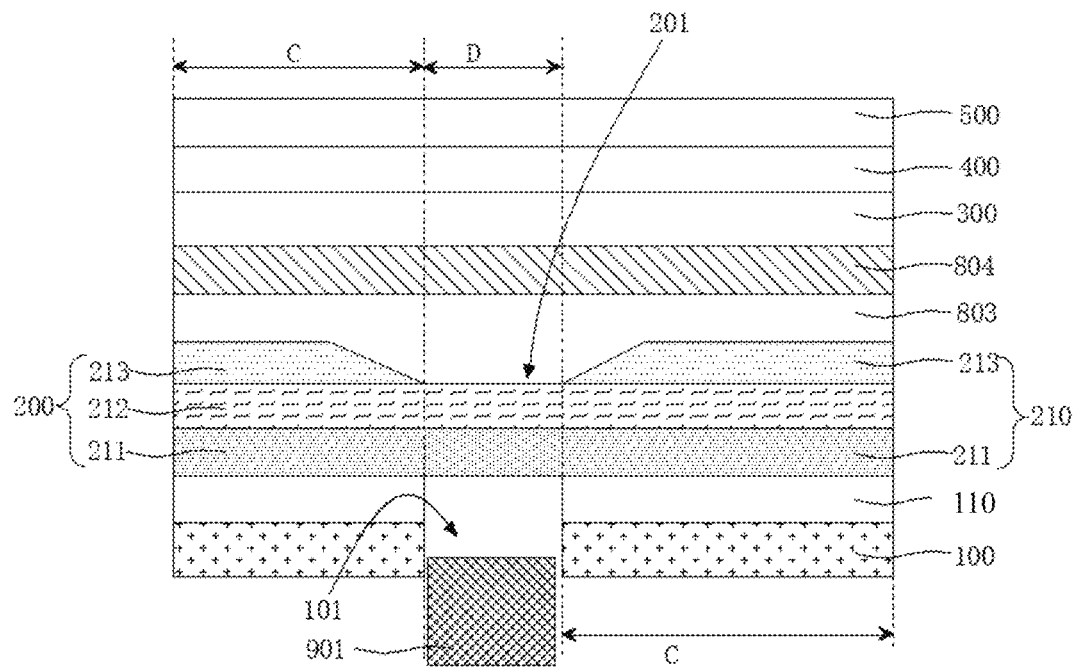
FIG. 5 is a partially sectional structural schematic view of a display device in an embodiment of the present disclosure.

For example, referring to FIG. 5, the anti-reflection groove 201 may penetrate through the second organic material layer 213 and expose a part of the first barrier layer 212. In other words, the second organic material layer 213 may be provided with a via hole exposing the first barrier layer 212, and the via hole may serve as the anti-reflection groove 201 provided on the base substrate 200. That is, the depth of the anti-reflection groove 201 is equal to the thickness of the second organic material layer 213, thereby greatly thinning the organic material layer 210 of the base substrate 200, and improving the transmittance of the display panel in the second display area D.

Optionally, in this embodiment, the anti-reflection groove 201 may be a first anti-reflection groove. That is, the size of the notch of the anti-reflection groove 201 is larger than the size of the bottom of the anti-reflection groove 201, thereby ensuring that the materials of the driving circuit and the pixel light-emitting layer 400 may sequentially cover the anti-reflection groove 201, and avoiding breakage at the anti-reflection groove 201. The anti-reflection groove 201 is also convenient for preparation, for example, by photolithography or exposure development.

Figure 14:
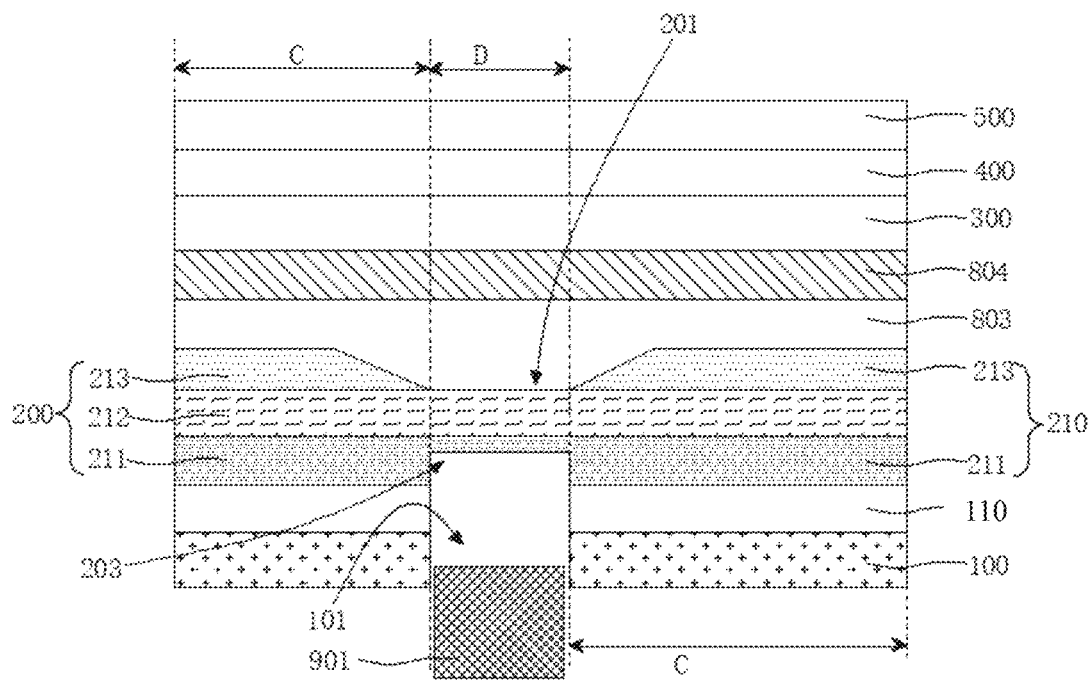
FIG. 14 is a partially sectional structural schematic view of a display device in an embodiment of the present disclosure.
Figure 15:
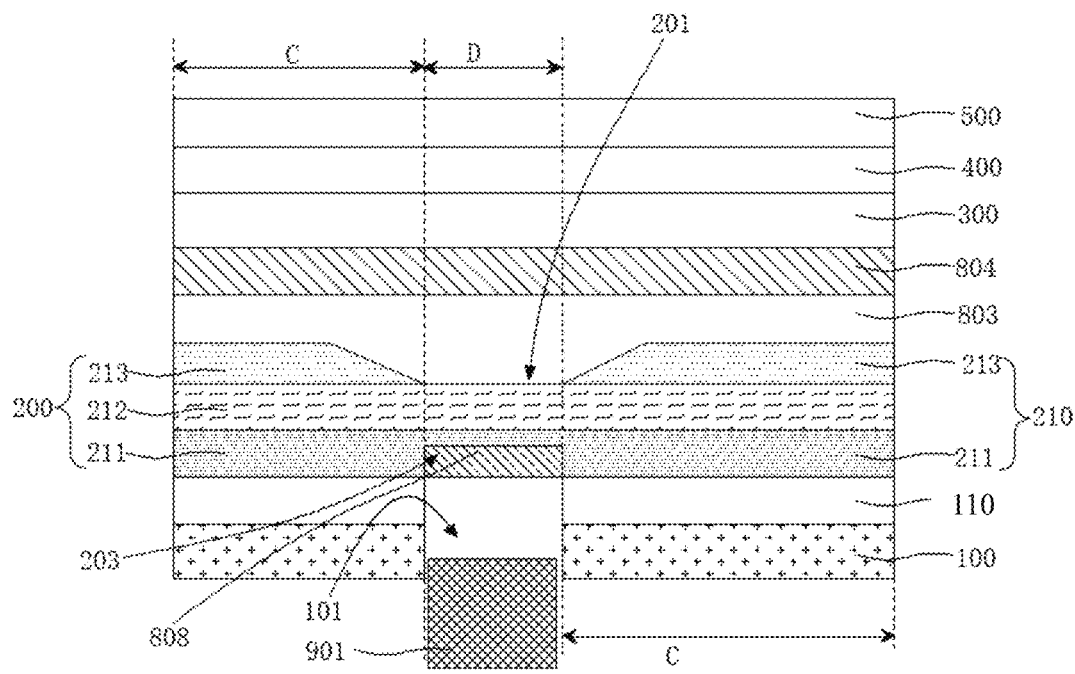
FIG. 15 is a partially sectional structural schematic view of a display device in an embodiment of the present disclosure.
Figure 16:
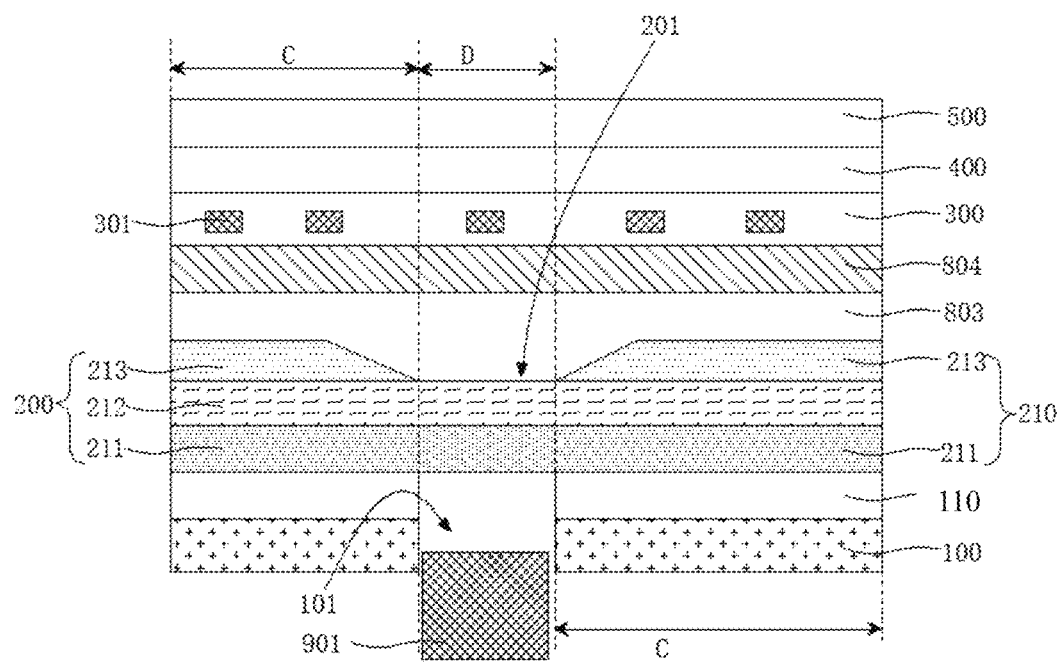
FIG. 16 is a partially sectional structural schematic view of a display device in an embodiment of the present disclosure.
Figure 17:
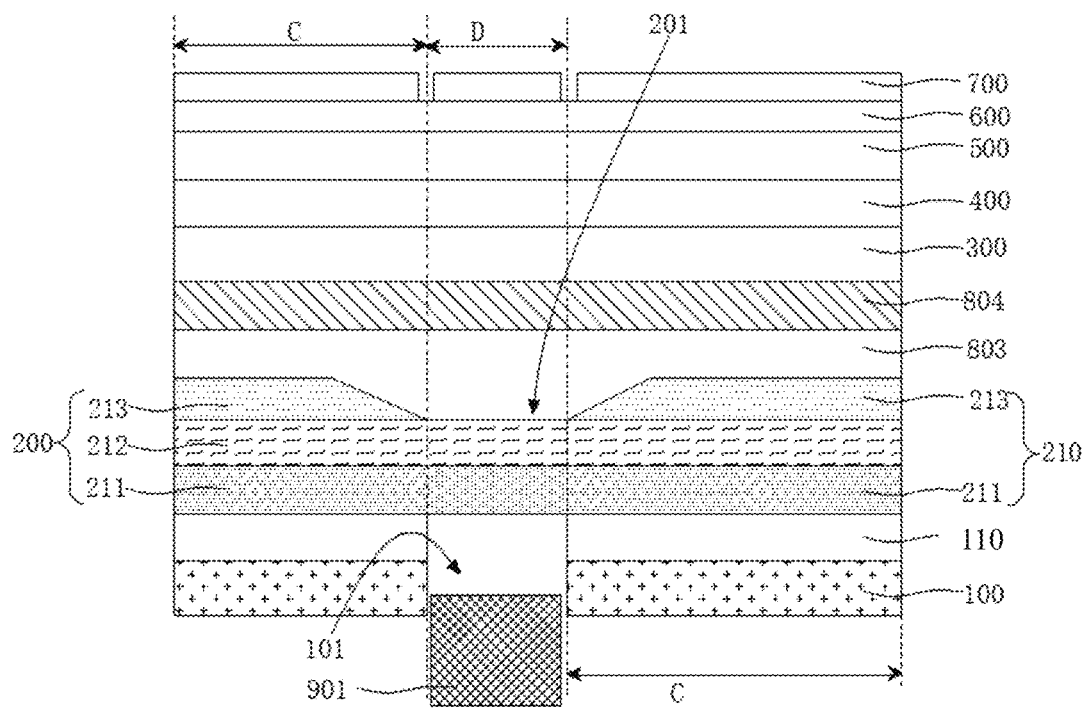
FIG. 17 is a partially sectional structural schematic view of a display device in an embodiment of the present disclosure.

Optionally, referring to FIG. 14, when the anti-reflection groove 201 is arranged in the second organic material layer 213, a thinning groove 203 may also be provided at a side of the first organic material layer 211 away from the driving circuit layer 300, and an orthographic projection of the thinning groove 203 on the base substrate 200 covers the second display area D, so as to further reduce the transmittance of the display panel in the second display area D. In an embodiment of the present disclosure, the slope angle of the first organic material layer is 80 degrees to 90 degrees at a position close to the thinning groove.

Figure 18:
FIG. 18 is a structural schematic view of a supporting substrate having a protruding layer in an embodiment of the present disclosure.
Figure 19:
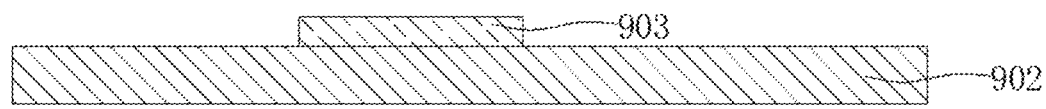
FIG. 19 is a structural schematic view of a supporting substrate having a protruding layer in an embodiment of the present disclosure.
Figure 20:
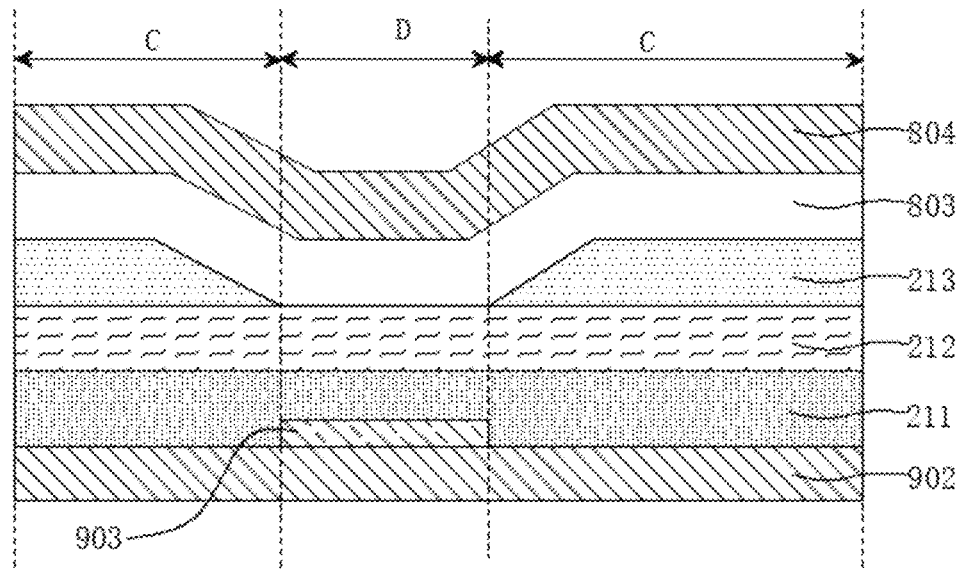
FIG. 20 is a structural schematic view of preparing a base substrate on a supporting substrate in an embodiment of the present disclosure.
Figure 21:
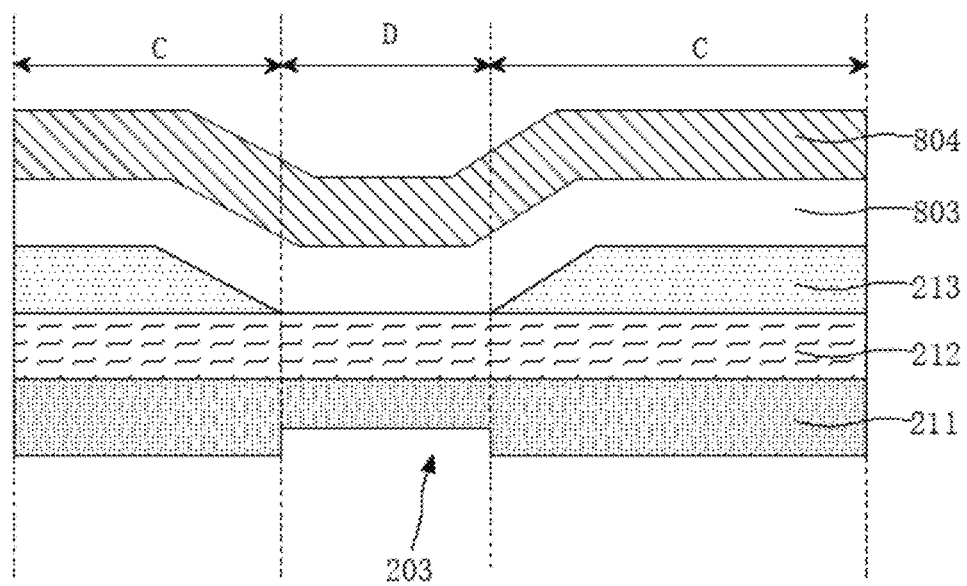
FIG. 21 is a structural schematic view of the substrate after peeling off a supporting substrate in an embodiment of the present disclosure.

Optionally, the thinning groove may be formed by the following methods: referring to FIGS. 18 and 19, a supporting substrate 902 with a protruding layer 903 corresponding to the thinning groove 203 may be provided first; and then, referring to FIG. 20, the base substrate and the film layers above the base substrate may be sequentially formed. Then, referring to FIG. 21, the supporting substrate 902 may be peeled off and the protruding layer 903 may be simultaneously peeled off, and the peeling off of the protruding layer 903 enables the back surface of the base substrate to be formed with a thinning groove 203. Alternatively, the supporting substrate 902 may be a glass substrate. Optionally, the protruding layer 903 may be made of an inorganic material.

For example, referring to FIG. 18, the supporting substrate 902 may be a glass substrate, and the glass substrate is patterned to form a protruding layer 903 on the surface of the glass substrate. For another example, referring to FIG. 19, a light-transmitting material layer may be formed on the surface of the supporting substrate 902, and the light-transmitting material layer may be made of an inorganic material such as silicon oxide, silicon nitride, silicon oxynitride and metal oxide. Then, the light-transmitting material layer is patterned to form the protruding layer 903. Further, the protruding layer 903 has a certain transmittance in an ultraviolet band for laser peeling.

For another example, the surface of the protruding layer may also be provided with a sacrificial layer, for example, a sacrificial layer made of an inorganic material such as silicon nitride and silicon oxide. When the protruding layer is peeled off, a mechanical peeling method may also be used for peeling off. In this embodiment, the protruding layer may include an opaque material, for example, it may be a metal film layer.

Figure 22:
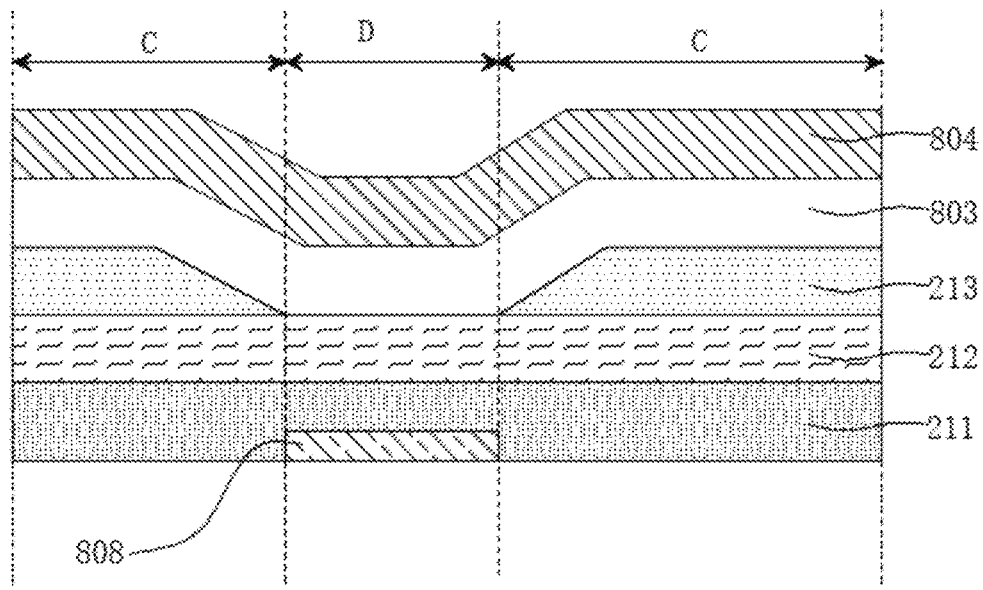
FIG. 22 is a structural schematic view of the substrate after peeling off a supporting substrate in an embodiment of the present disclosure.

Optionally, the protruding layer 903 may be made of a material with high transmittance, and its transmittance is greater than that of the first organic material layer 211. In this way, referring to FIGS. 22 and 15, the protruding layer 903 may not be peeled off, so that the protruding layer 903 may be embedded in the first organic material layer 211 of the base substrate 200 to act as a third filling material layer 808 filled in the thinning groove 203. In other words, the display panel may further include a third filling material layer 808 embedded in the thinning groove 203. A transmittance of the third filling material layer 808 is greater than that of the first organic material layer 211. In an embodiment of the present disclosure, the third filling material layer 808 is a colorless and transparent organic material, such as a colorless and transparent polyimide material.

Figure 6:
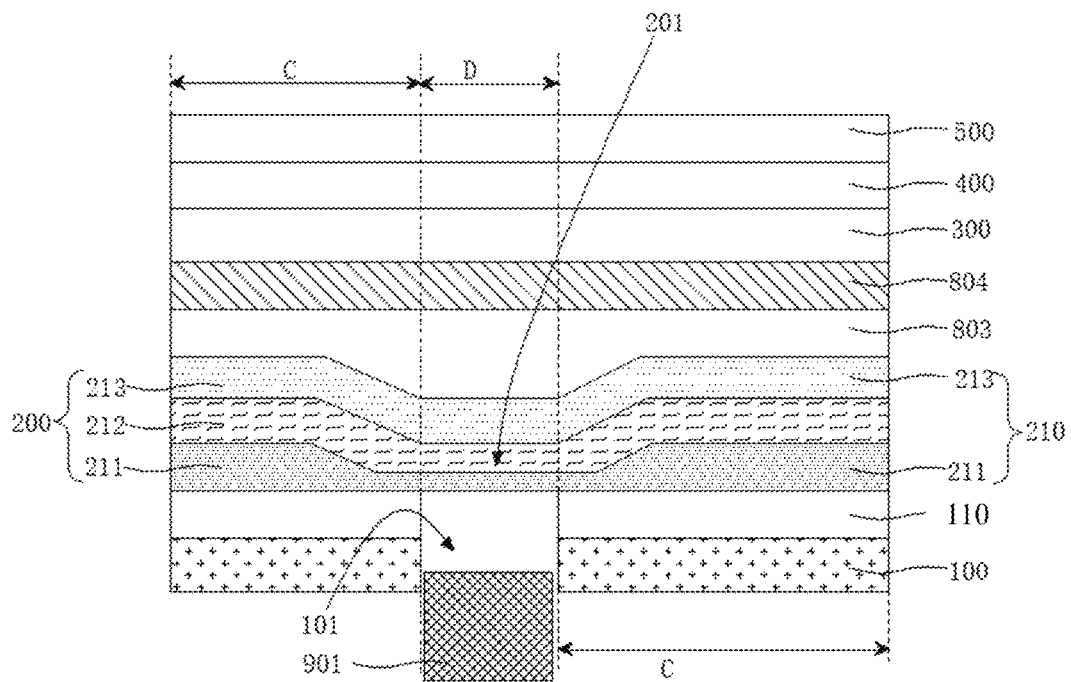
FIG. 6 is a partially sectional structural schematic view of a display device in an embodiment of the present disclosure.

In other embodiments, referring to FIG. 6, the first organic material layer 211 is provided with an anti-reflection groove 201 at a side close to the driving circuit layer 300. In this way, the base substrate 200 of the present disclosure may achieve thinning of the first organic material layer 211 in the second display area D, thereby improving the transmittance of the display panel in the second display area D.

Optionally, in this embodiment, the anti-reflection groove 201 may be the first anti-reflection groove, that is, the size of the notch is larger than the size of the bottom, thereby ensuring that the materials of the driving circuit layer and the pixel light-emitting layer may sequentially cover the anti-reflection groove 201, and avoiding breakage at the anti-reflection groove 201. The anti-reflection groove 201 is also convenient for preparation, for example, by photolithography or exposure development.

Figure 7:
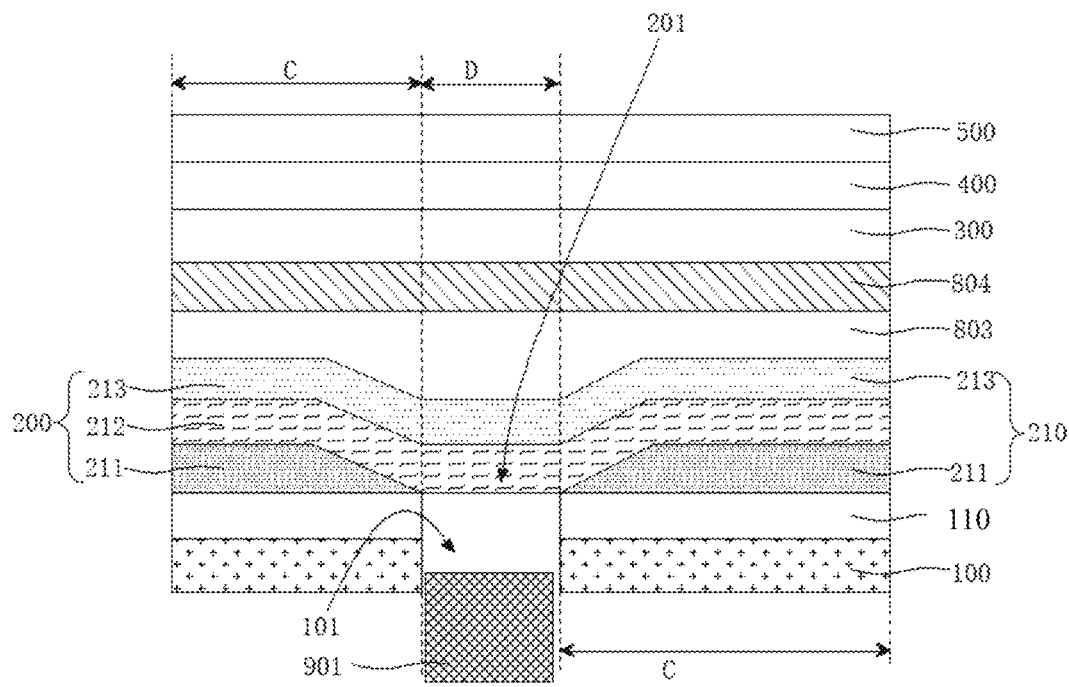
FIG. 7 is a partially sectional structural schematic view of a display device in an embodiment of the present disclosure.

Optionally, in an embodiment, referring to FIGS. 6 and 7, the first barrier layer 212 and the second organic material layer 213 may sequentially cover the anti-reflection groove 201 on the first organic material layer 211. In another embodiment, referring to FIG. 8, the first barrier layer 212 may have a hollowed-out hole 202 exposing the anti-reflection groove 201. An edge of the hollowed-out hole 202 coincides with an edge of the notch of the anti-reflection groove 201 close to the first barrier layer 212. In this way, the first organic material layer 211 may be patterned using the first barrier layer 212 as a mask to form the required anti-reflection groove 201.

Optionally, the second organic material layer 213 may be made of a high transparent organic material, such as colorless and transparent polyimide material, so that the transmittance of the second organic material layer 213 is greater than the transmittance of the first organic material layer 211, thereby further improving the transmittance of the second display area D.

Alternatively, the depth of the anti-reflection groove 201 may be 0.5-1 times the thickness of the first organic material layer 211. Further, the depth of the anti-reflection groove 201 may be 0.8 to 1 times the thickness of the first organic material layer 211.

Figure 8:
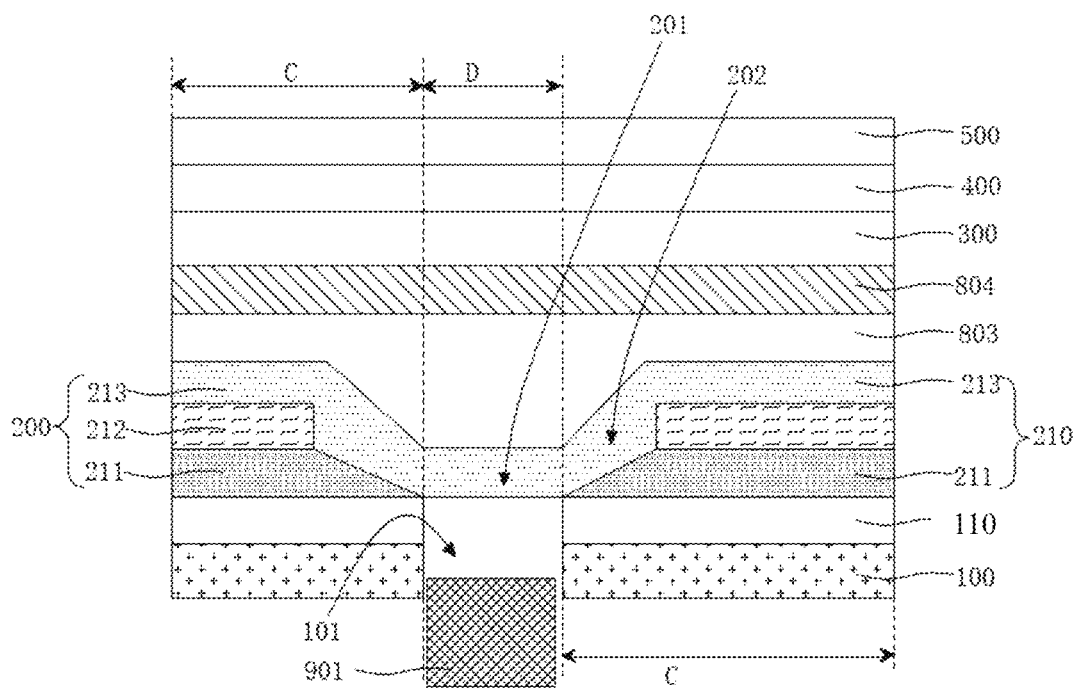
FIG. 8 is a partially sectional structural schematic view of a display device in an embodiment of the present disclosure.

For example, referring to FIGS. 7 and 8, the anti-reflection groove 201 penetrates through the first organic material layer 211. In other words, the depth of the anti-reflection groove 201 is one time the thickness of the first organic material layer 211.

Figure 9:
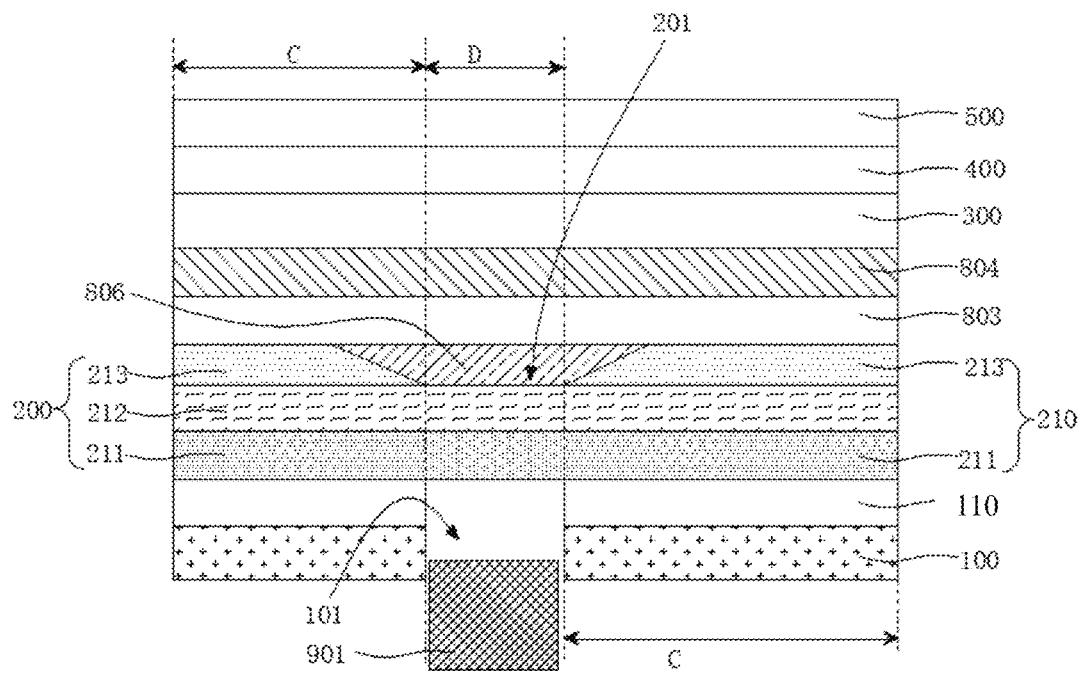
FIG. 9 is a partially sectional structural schematic view of a display device in an embodiment of the present disclosure.
Figure 10:
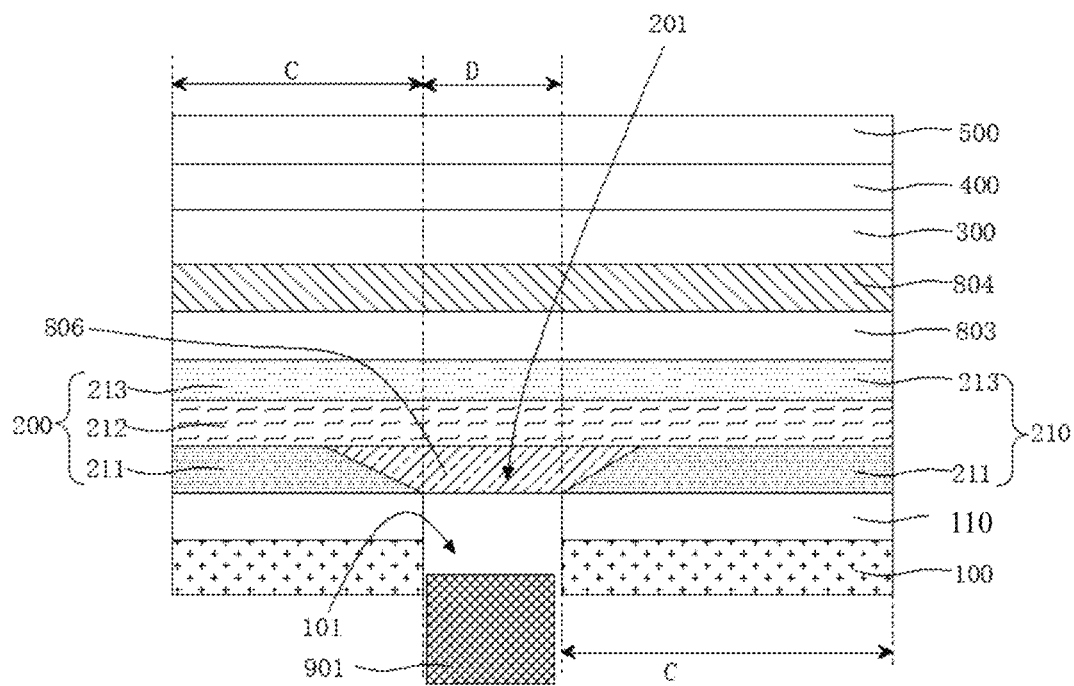
FIG. 10 is a partially sectional structural schematic view of a display device in an embodiment of the present disclosure.

In other embodiments, referring to FIGS. 9 and 10, the display panel further includes a first filling material layer 806, and the first filling material layer 806 is located between the base substrate 200 and the driving circuit layer 300 and in the anti-reflection groove 201. A transmittance of the first filling material layer 806 is greater than the transmittance of the first organic material layer 211. In this way, the first filling material layer 806 may fill up the surface of the base substrate 200 and provide a relatively flat surface for the driving circuit layer 300.

Optionally, the first filler material layer 806 is made of an organic material to improve the flexibility of the display panel and enhance the performance of the base substrate 200. Further, the first filling material layer 806 may be made of a colorless and transparent polyimide material.

Optionally, the first filling material layer 806 may be arranged in the first anti-reflection groove.

Figure 11:
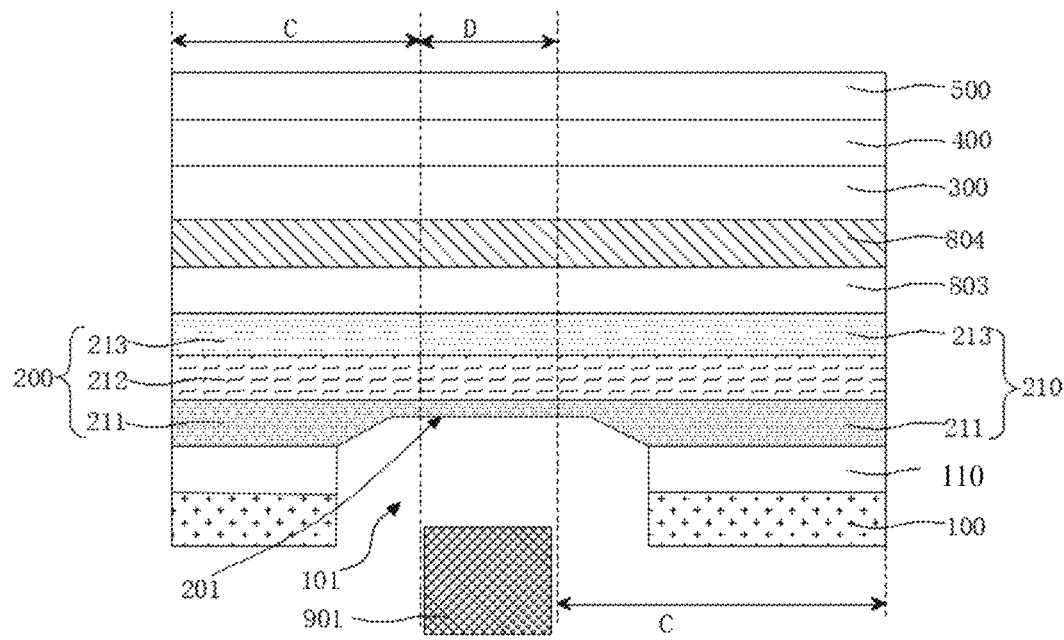
FIG. 11 is a partially sectional structural schematic view of a display device in an embodiment of the present disclosure.
Figure 12:
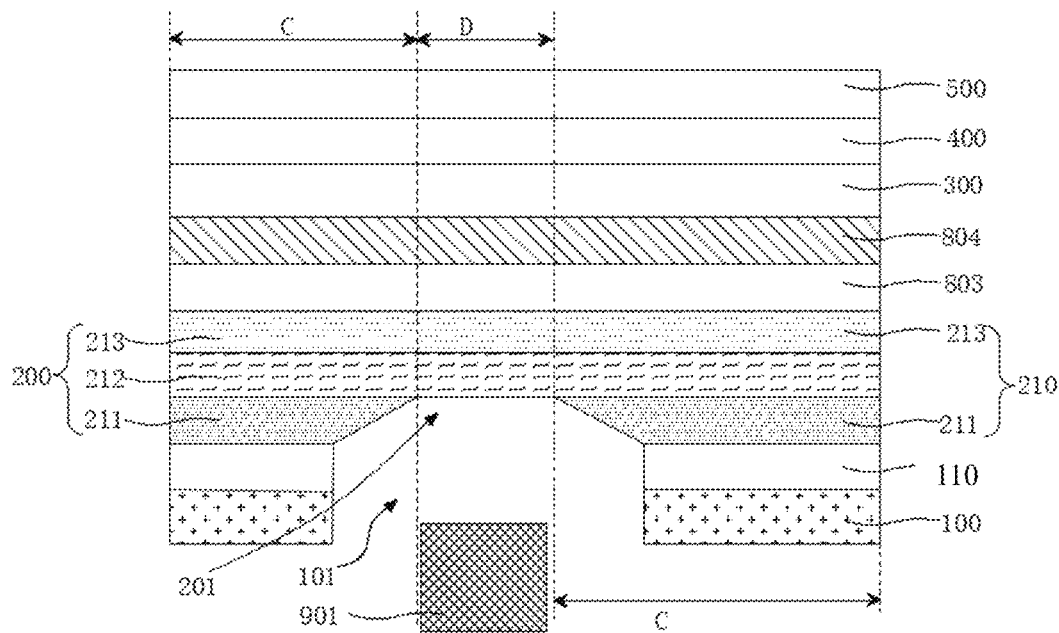
FIG. 12 is a partially sectional structural schematic view of a display device in an embodiment of the present disclosure.
Figure 13:
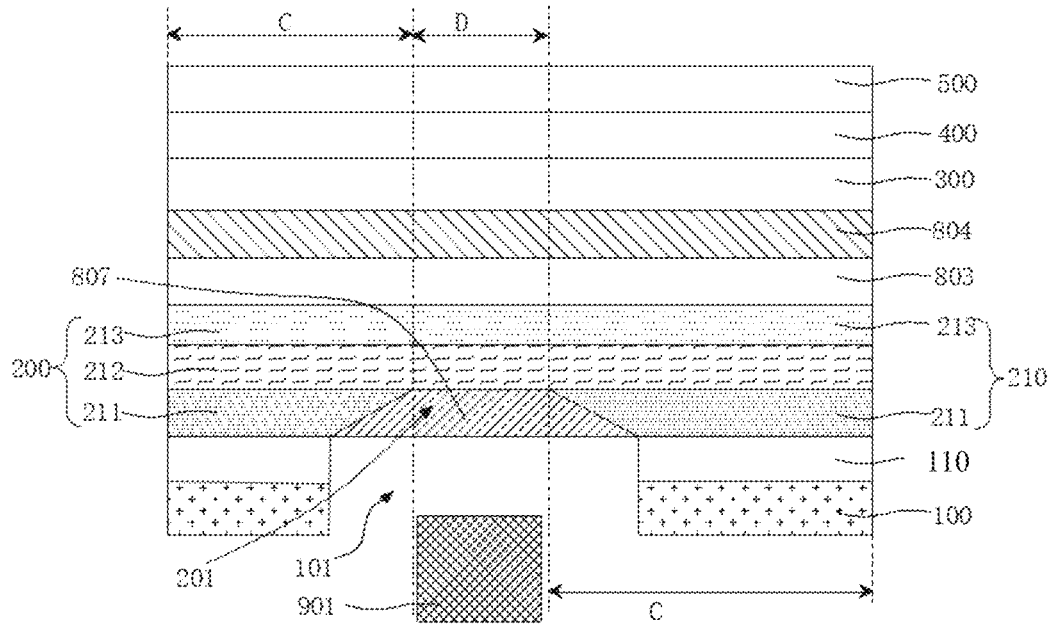
FIG. 13 is a partially sectional structural schematic view of a display device in an embodiment of the present disclosure.

In other embodiments, referring to FIG. 11, the first organic material layer 211 is provided with an anti-reflection groove 201 at a side away from the driving circuit layer 300. In other words, the anti-reflection groove 201 is arranged in the first organic material layer 211 and the notch is located on the surface of the first organic material away from the driving circuit layer 300. In this way, the first organic material layer 211 may be thinned without affecting the flatness of the surface of the base substrate 200 at a side close to the base substrate 200.

Optionally, the anti-reflection groove 201 is the second anti-reflection groove, that is, the size of the notch of the anti-reflection groove 201 is larger than the size of the bottom, which can facilitate the preparation of the anti-reflection groove 201.

Figure 23:
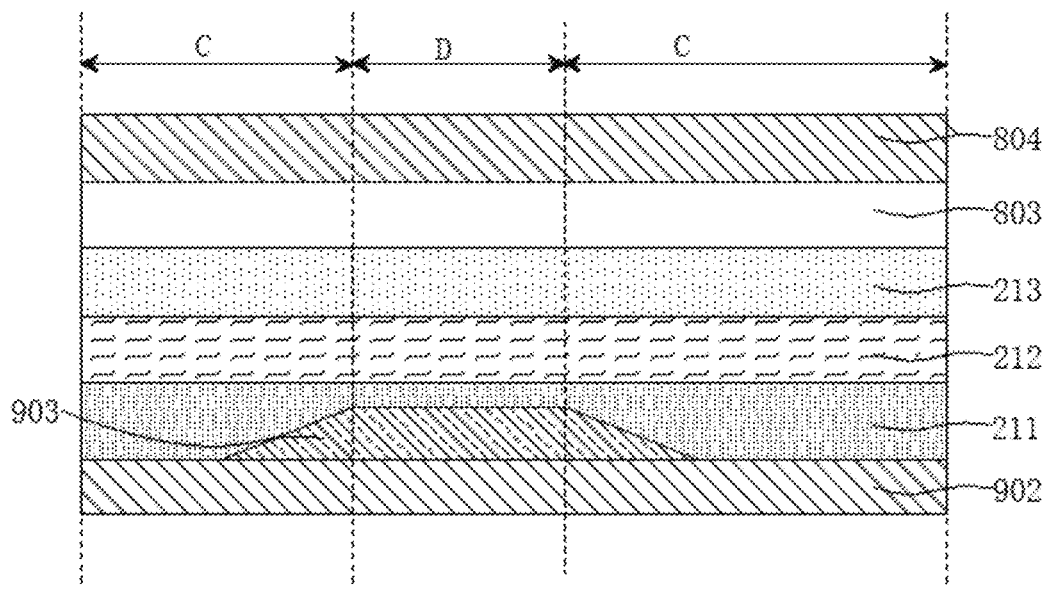
FIG. 23 is a structural schematic view of preparing a base substrate on a supporting substrate in an embodiment of the present disclosure.
Figure 24:
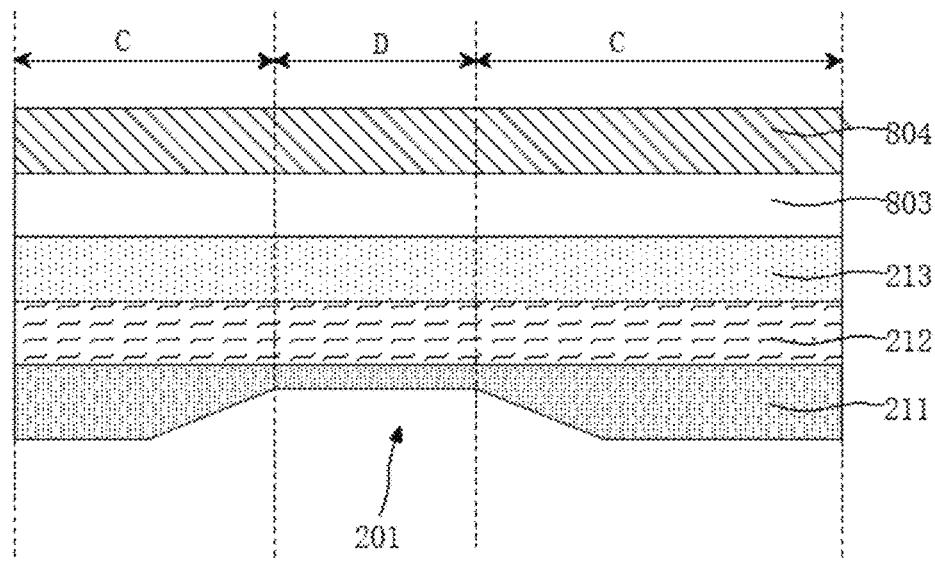
FIG. 24 is a structural schematic view of a base substrate after peeling off a supporting substrate in an embodiment of the present disclosure.

In a manufacturing method, referring to FIG. 23, a supporting substrate 902 having a protruding layer 903 corresponding to the anti-reflection groove 201 may be provided first, and then various film layers such as a base substrate and the like may be sequentially formed. Then, referring to FIG. 24, the supporting substrate 902 may be peeled off and the protruding layer 903 may be peeled off simultaneously, and the peeling of the protruding layer 903 enables the back surface of the base substrate 200 to form the anti-reflection groove 201.

Alternatively, the supporting substrate 902 may be a glass substrate. Optionally, the protruding layer 903 may be made of an inorganic material.

For example, the glass substrate may be patterned to form the protruding layer 903 on the surface of the glass substrate. For another example, a light-transmitting material layer may be formed on the surface of the glass substrate. The light-transmitting material layer may be made of an inorganic material such as silicon oxide, silicon nitride, silicon oxynitride or metal oxide. Then, the light-transmitting material layer is patterned to form the protruding layer 903. Further, the protruding layer 903 has a certain transmittance in the ultraviolet band for laser peeling. For another example, the surface of the protruding layer 903 may also be provided with a sacrificial layer, for example, a sacrificial layer made of inorganic materials such as silicon nitride and silicon oxide. When the protruding layer 903 is peeled off, it may also be peeled off by mechanical peeling. In this embodiment, a material of the protruding layer 903 may include an opaque material, for example, the protruding layer may be a metal film layer.

Figure 25:
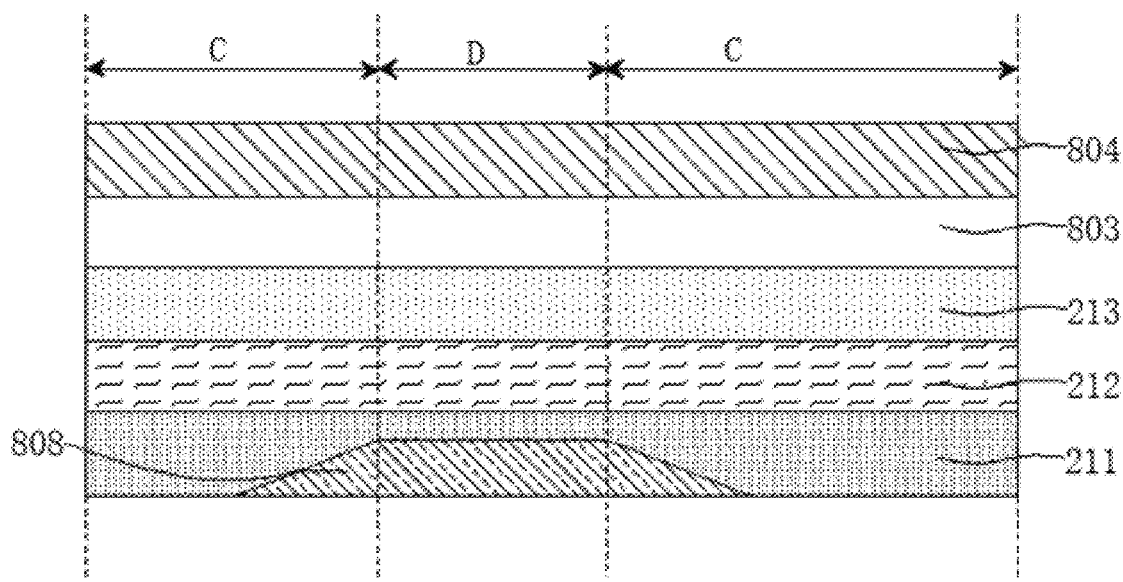
FIG. 25 is a structural schematic view of a base substrate after peeling off a supporting substrate in an embodiment of the present disclosure.

In another embodiment of the present disclosure, the protruding layer 903 may be made of a material with a high transmittance, and has a transmittance greater than that of the first organic material layer 211. In this way, referring to FIGS. 25 and 13, the protruding layer 903 may not be peeled off, so that the protruding layer 903 may be embedded in the first organic material layer 211 of the base substrate 200 to act as the second filling material layer 807 filled in the anti-reflection groove 201. In other words, the display panel may further include a second filling material layer 807 embedded in the anti-reflection groove 201. The transmittance of the second filling material layer 807 is greater than that of the first organic material layer 211.

Alternatively, the depth of the anti-reflection groove 201 may be 0.5-1 times the thickness of the first organic material layer 211. Further, the depth of the anti-reflection groove 201 may be 0.8-1 times the thickness of the first organic material layer 211. For example, referring to FIG. 12, the anti-reflection groove 201 penetrates through the first organic material layer 211. In other words, the depth of the anti-reflection groove 201 is one time the thickness of the first organic material layer 211.

Optionally, referring to FIGS. 4 to 17, the back film layer 100 is located at a side of the base substrate 200 away from the driving circuit layer 300. The back film layer 100 is provided with an opening 101, and the second display area D is located in the orthographic projection of the opening 101 on the base substrate 200. Further, the back film layer 100 may be connected with the base substrate 200 through the adhesion layer 110, and the adhesion layer 110 also does not cover the second display area D.

The embodiment of the present disclosure also provides a display device, which includes the display panel described in any one of the above display panel embodiments. The display device may be a smart phone screen, a smart watch screen or another type of display device. Since the display device has the display panel described in any one of the above display panel embodiments, it has the same beneficial effects, and the present disclosure will not be repeated herein.

In an embodiment of the present disclosure, referring to FIGS. 4 to 17, the display device includes a display panel and at least one photosensitive assembly 901, and the photosensitive assembly 901 is located at a side of the display panel close to the base substrate 200 and directly faces the second display area D.

Other embodiments of the present disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and embodiments be considered as exemplary only, with a true scope and spirit of the present disclosure being indicated by the following claims.

What is claimed is:

1. A display panel, comprising:
   a first display area and at least one second display area at a side of the first display area, a transmittance of the at least one second display area being greater than that of the first display area; and
   a base substrate, a driving circuit layer, and a pixel light-emitting layer which are sequentially laminated, wherein:
   the base substrate comprises a first organic material layer, a first barrier layer, and a second organic material layer which are sequentially laminated, the driving circuit layer is arranged at a side of the second organic material layer away from the first organic material layer, the first organic material layer is provided with a first groove at a side close to the driving circuit layer, and the first groove at least partially overlaps with the second display area; and
   a thickness of a part of the first organic material layer close to the first groove gradually decreases in a direction from the first display area to the second display area;
   wherein the first barrier layer has a hollowed-out hole exposing the first groove; an edge of the hollowed-out hole substantially coincides with an edge of the first groove close to an opening of the first barrier layer.

2. The display panel according to claim 1, wherein a slope angle of the first organic material layer is 10 degrees to 60 degrees at a position close to the first groove.

3. The display panel according to claim 1, wherein an orthographic projection of the first groove on the base substrate covers the second display area.

4. The display panel according to claim 1, further comprising:
   a second groove is arranged at a side of the second organic material layer away from the first organic material layer.

5. The display panel according to claim 4, wherein the second groove penetrates through the second organic material layer and exposes a part of the first barrier layer.

6. The display panel according to claim 1, wherein the first groove penetrates through the first organic material layer.

7. The display panel according to claim 1, wherein a transmittance of the second organic material layer is greater than that of the first organic material layer.

8. The display panel according to claim 4, wherein a size of a notch of the second groove is larger than a size of a bottom of the second groove.

9. The display panel according to claim 4, further comprising a first filling material layer, wherein the first filling material layer is located between the base substrate and the driving circuit layer and located in the second groove; and
   a transmittance of the first filling material layer is greater than a transmittance of the first organic material layer.

10. The display panel according to claim 9, further comprising a second filling material layer embedded in the first groove; wherein a transmittance of the second filling material layer is greater than a transmittance of the first organic material layer.

11. The display panel according to claim 10, wherein the transmittance of the first filling material layer is the same as the transmittance of the second filling material layer.

12. The display panel according to claim 4, wherein:
    the second groove at least partially overlaps with the second display area; and
    a thickness of a part of the second organic material layer close to the second groove gradually decreases in a direction from the first display area to the second display area.

13. The display panel according to claim 4, wherein a slope angle of the second organic material layer is 10 degrees to 60 degrees at a position close to the second groove.

14. The display panel according to claim 4, wherein a width of an orthographic projection, in the direction from the first display area to the second display area, of the second organic material layer close to a side wall of the second groove on the base substrate is not more than 30 microns.

15. The display panel according to claim 4, wherein an orthographic projection of the second groove on the base substrate covers the second display area.

16. The display panel according to claim 1, further comprising a back film layer located at a side of the base substrate away from the driving circuit layer; wherein the back film layer is provided with an opening, and the second display area is located in an orthographic projection of the opening on the base substrate.

17. The display panel according to claim 1, further comprising a second barrier layer and a buffer layer which are sequentially laminated between the base substrate and the driving circuit layer, wherein the buffer layer is located at a side of the second barrier layer away from the base substrate; and wherein the display panel further comprises a planarization layer located between the pixel light-emitting layer and the driving circuit layer.

18. The display panel according to claim 1, wherein a width of an orthographic projection, in the direction from the first display area to the second display area, of the first organic material layer close to a side wall of the first groove on the base substrate is not more than 30 microns.

19. The display panel according to claim 1, wherein a size of a notch of the first groove is larger than a size of a bottom of the first groove.

20. A display device, comprising a display panel and at least one photosensitive assembly, wherein:
    the display panel comprises a first display area and at least one second display area at a side of the first display area;
    a transmittance of the second display area is greater than that of the first display area;
    the display panel further comprises a base substrate, a driving circuit layer, and a pixel light-emitting layer which are sequentially laminated;
    the base substrate comprises a first organic material layer, a first barrier layer, and a second organic material layer which are sequentially laminated, the driving circuit layer is arranged at a side of the second organic material layer away from the first organic material layer;
    the first organic material layer is provided with a first groove at a side close to the driving circuit layer;

the first groove at least partially overlaps with the second display area;

a thickness of a part of the first organic material layer close to the first groove gradually decreases in a direction from the first display area to the second display area;

wherein the first barrier layer has a hollowed-out hole exposing the first groove, and an edge of the hollowed-out hole substantially coincides with an edge of the first groove close to an opening of the first barrier layer; and the photosensitive assembly is located at a side of the display panel close to the base substrate and directly faces the second display area.

\* \* \* \* \*